United States Patent
Han et al.

(10) Patent No.: US 10,314,191 B2
(45) Date of Patent: Jun. 4, 2019

(54) ASSEMBLY ALIGNMENT ASSISTANCE STRUCTURE FOR MEMBER, AND CASING OF ELECTRONIC DEVICE

(71) Applicant: MITSUBISHI ELECTRIC CORPORATION, Tokyo (JP)

(72) Inventors: Fuqiang Han, Tokyo (JP); Naoki Numata, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/571,591

(22) PCT Filed: Aug. 4, 2015

(86) PCT No.: PCT/JP2015/072037
§ 371 (c)(1),
(2) Date: Nov. 3, 2017

(87) PCT Pub. No.: WO2017/022067
PCT Pub. Date: Feb. 9, 2017

(65) Prior Publication Data
US 2018/0124943 A1    May 3, 2018

(51) Int. Cl.
H05K 7/14    (2006.01)
H05K 5/04    (2006.01)

(52) U.S. Cl.
CPC ............ *H05K 7/14* (2013.01); *H05K 5/04* (2013.01); *H05K 7/1411* (2013.01); *H05K 7/1418* (2013.01); *H05K 7/1422* (2013.01)

(58) Field of Classification Search
CPC ...... H05K 7/14; H05K 7/1411; H05K 7/1418; H05K 7/1422; H05K 5/04; G06F 1/181; G06F 1/184; G06F 1/186
(Continued)

(56) References Cited

U.S. PATENT DOCUMENTS 5,282,556 A * 2/1994 Bossert ............... B60R 7/04
224/281
5,503,472 A * 4/1996 Vu .................. G11B 23/12
312/223.2
(Continued)

FOREIGN PATENT DOCUMENTS

JP      10-290081 A      10/1998
JP      2004-362799 A    12/2004
WO      WO 2014/002261 A1  1/2014

OTHER PUBLICATIONS

International Search Report, issued in PCT/JP2015/072037, PCT/ISA/210, dated Nov. 10, 2015.

*Primary Examiner* — Janet M Wilkens
(74) *Attorney, Agent, or Firm* — Birch, Stewart, Kolasch & Birch, LLP

(57) ABSTRACT

A bent part (42) extends from an edge part of a wall part (41) being parallel to the direction of insertion of a rail part (90a). The bent part (42) has an arm part (42a) extending in a direction crossing the direction of insertion, and a contact surface part (42b) extending from the arm part (42a) in a direction crossing the direction of the arm part (42a). An opening of a slit (43) formed between the wall part (41) and the bent part (42) faces an opening of a cutout (61) into which the rail part (91a) is to be inserted. The contact surface part (42b) is sloped such that the rail part (90a) is slidingly guided into the slit (43).

2 Claims, 3 Drawing Sheets

(58) Field of Classification Search
USPC .............................. 312/223.2; 361/797, 752
See application file for complete search history.

(56) References Cited

U.S. PATENT DOCUMENTS

| | | | | |
|---|---|---|---|---|
| 6,751,100 | B2* | 6/2004 | Chen | G06F 1/181 312/223.1 |
| 6,754,071 | B2* | 6/2004 | Lin | G06F 1/184 248/694 |
| 7,483,263 | B2* | 1/2009 | Chen | G06F 1/181 312/223.2 |
| 8,238,097 | B2* | 8/2012 | Chen | G06F 1/184 361/679.58 |
| 8,474,917 | B2* | 7/2013 | Line | B60N 2/5825 297/188.04 |
| 8,570,758 | B2* | 10/2013 | Chiu | G06F 1/186 361/679.32 |
| 9,854,683 | B2* | 12/2017 | Hassler | H04B 1/082 |
| 2004/0042193 | A1* | 3/2004 | Kirner | H05K 7/142 361/797 |
| 2004/0207297 | A1* | 10/2004 | Chen | G06F 1/184 312/223.2 |
| 2004/0242059 | A1 | 12/2004 | Aoyama et al. | |
| 2005/0105266 | A1* | 5/2005 | Wang | G06F 1/181 361/679.33 |
| 2008/0049949 | A1* | 2/2008 | Snider | H04B 1/082 381/86 |
| 2009/0213560 | A1* | 8/2009 | Huang | G03B 21/145 361/752 |
| 2010/0103595 | A1* | 4/2010 | Hsu | G06F 1/1601 361/679.01 |
| 2015/0050082 | A1 | 2/2015 | Goto et al. | |
| 2015/0108883 | A1* | 4/2015 | Chen | H05K 7/16 312/223.2 |
| 2016/0044799 | A1* | 2/2016 | Igari | H05K 5/006 361/752 |
| 2016/0150666 | A1* | 5/2016 | Han | G06F 1/183 312/321.5 |

\* cited by examiner

US 10,314,191 B2

ASSEMBLY ALIGNMENT ASSISTANCE STRUCTURE FOR MEMBER, AND CASING OF ELECTRONIC DEVICE

TECHNICAL FIELD

The present invention relates to a structure for guiding one member to an appropriate position with respect to another member for smooth alignment in assembling the members together.

BACKGROUND ART

Due to reduction in size of electronic devices, restrictions have increased for an installation position of an alignment part which is used to assemble members composing an electronic device. Therefore, recently, in many cases, when an assembly worker attaches one member to the other member, an alignment part of the other member for attaching it to the one member is formed in a part being invisible to the assembly worker. For an assembly worker who cannot see the alignment part, it is difficult to perform alignment smoothly, so that the assembling workability deteriorates.

Conventionally, in assembly of members, a structure for guiding one member to a desirable position on another member is known. Patent Literature 1, for example, discloses a structure of a pair of upper and lower pinch holding pieces formed by bending of a chassis to insert an outer edge of a circuit board into the chassis. By forming a taper to each pinch holding piece, the circuit board is introduced to a slit between holding the pinch holding pieces.

The guide structure for a member described in Patent Literature 1 may also be employed as a guide for the member to an alignment part provided to a site invisible to the assembly worker.

CITATION LIST

Patent Literature

Japanese Patent Application Publication No. Hei 10-290081 (1998-290081)

SUMMARY OF INVENTION

Technical Problem

In the structure described in Patent Literature 1, however, parts of the outer edge of a side plate of the chassis are inwardly bent to form the pinch holding pieces. Therefore, when the pinch holding pieces are viewed from the member such as the circuit board to be inserted, the width in the lateral direction, which is orthogonal to the vertical direction, of each of the pinch holding pieces is not more than the thickness of a side plate of the chassis. As a result, when the member is inserted, if the member is shifted in the lateral direction by a distance roughly equal to the thickness of the side plate, the member does not come into contact with the tapered portions of the pinch holding pieces and thus the member cannot be inserted between the pinch holding pieces. Further, the pinch holding pieces do not have a mechanism for regulating moving of the member in the lateral direction. Therefore, even if a member is once inserted between the pinch holding pieces, if the member moves a distance roughly equal to the thickness of the side plate in the lateral direction, the member is detached from the pinch holding pieces.

As described above, in the structure described in Patent Literature 1, the reliability to be able to guide the member is low.

The present invention has been made to solve the above problem, and an object of the invention is to provide assembly alignment assistance structure for a member that can guide the member to a site at which the member is to be mounted in high reliability.

Solution to Problem

An assembly alignment assistance structure for a member according to the present invention includes: a first sheet metal member having a wall part and a bent part, the wall part being in parallel with a direction of insertion of a first rail part of a guide target member mounted on the member, the bent part being bent at an edge part of the wall part such that a slit into which the first rail part is inserted is formed between the bent part and the wall part; a second sheet metal member having a cutout, into which a second rail part of the guide target member is to be inserted, the second rail part extending in parallel with the first rail part, the cutout forming an opening facing an opening of the slit. The bent part has an arm part extending from the edge part of the wall part in a direction crossing the direction of insertion and a contact surface part extending from the arm part in a direction crossing the direction of the arm part. The contact surface part is sloped with respect to the direction of insertion such that, when the guide target member is inserted, the first rail part coming into contact with the contact surface part is slidingly guided into the slit.

Advantageous Effects of Problem

According to the present invention, it is possible to provide assembly alignment assistance structure for a member that can guide the member to a site at which the member is to be mounted in high reliability.

DESCRIPTION OF EMBODIMENTS

Some embodiments of the present invention will now be described in more detail with reference to the accompanying drawings.

Embodiment 1

Figure 1:
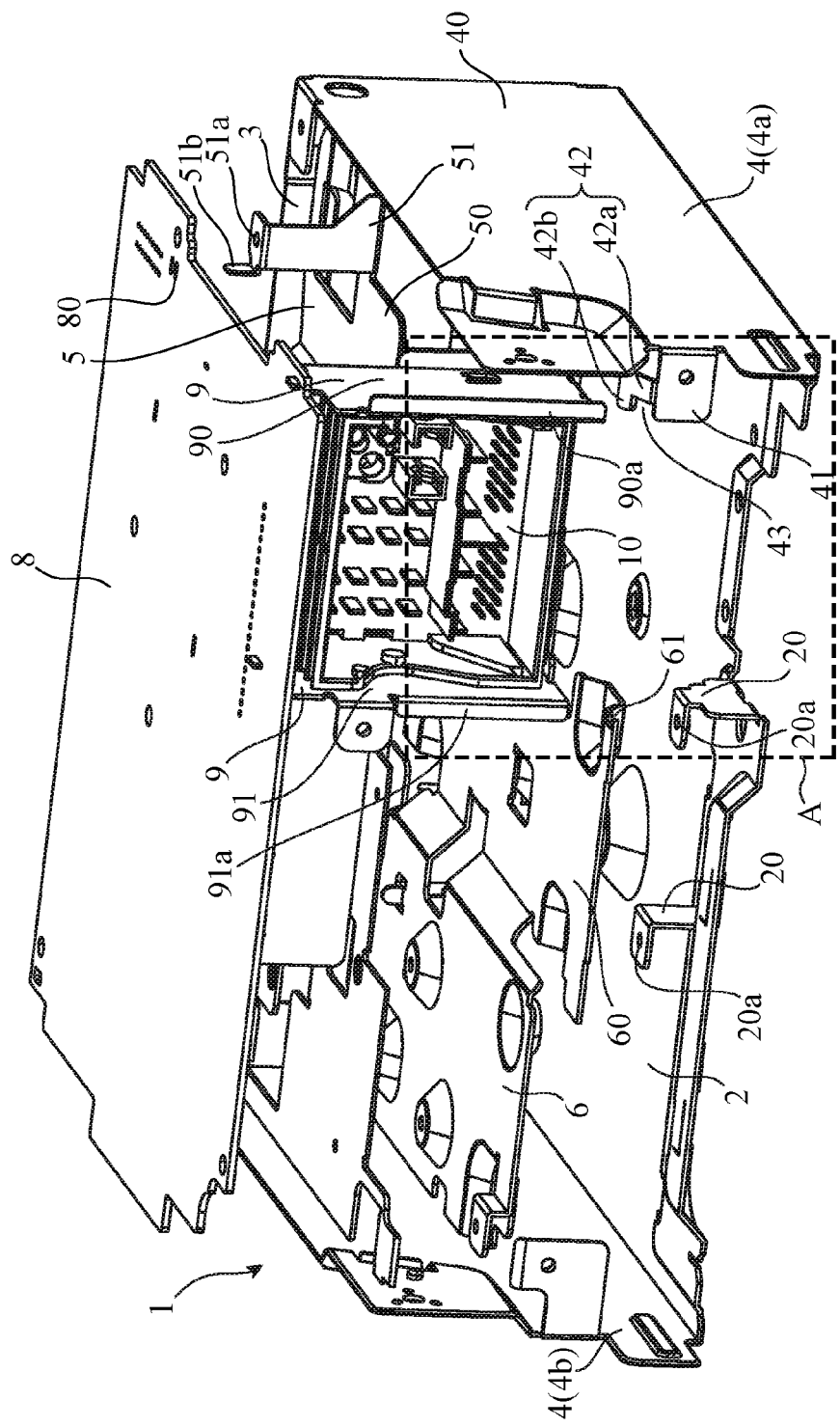
FIG. 1 is a perspective view illustrating a casing and a circuit board of an electronic device including an assembly alignment assistance structure for a member according to an embodiment 1 of the present invention in a state before assembling.
Figure 2:
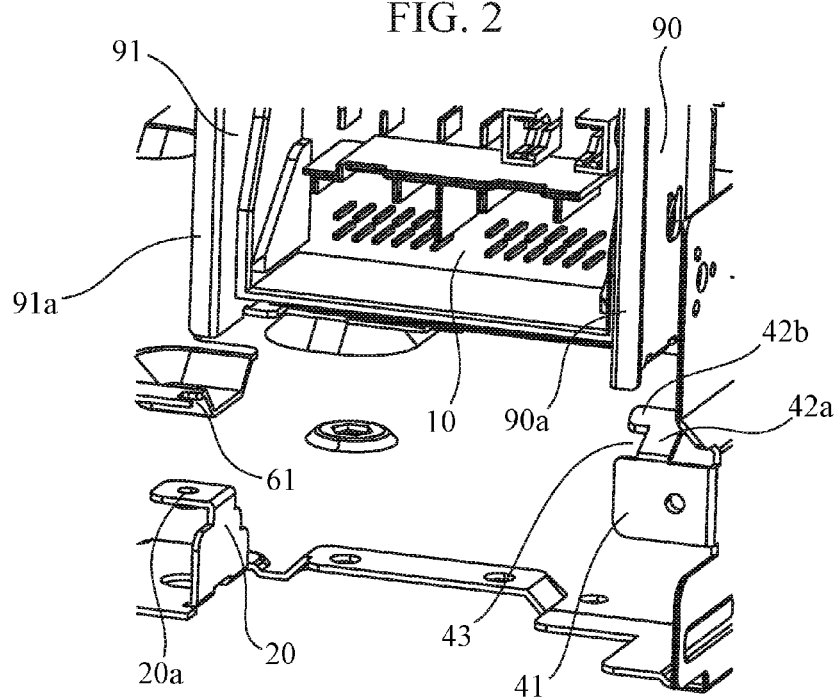
FIG. 2 is a partially enlarged view of FIG. 1.

FIG. 1 is a perspective view of a casing 1 and a circuit board 8 of an electronic device including assembly alignment assistance structure for a member according to embodiment 1 of the present invention in a state before assembling. The electronic device is, for example, a car navigation device or the like. FIG. 2 is an enlarged view of a portion A in FIG. 1.

The casing 1 includes a bottom chassis 2, a front chassis 3, side chassis 4, a first internal chassis 5, a second internal chassis 6, and a top chassis 7, which hold and accommodate the circuit board 8 onto which various types of electronic components are mounted. The top chassis 7 will be described later with reference to FIG. 4.

The bottom chassis 2, the front chassis 3, the side chassis 4, the first internal chassis 5, the second internal chassis 6, and the top chassis 7 are made by machining sheet metal appropriately.

The bottom chassis 2 has an attachment part 20 cut and raised to be bent toward the inner side of the casing 1. Screw holes 20a are formed in the attachment part 20.

The front chassis 3 and the side chassis 4 are disposed to be vertical to the bottom chassis 2 and the top chassis 7. The term "vertical" in the present invention represents approximately vertical substantially.

The side chassis 4 consists of a pair of side chassis 4a, 4b opposing one another. The side chassis 4a has a wall part 41 orthogonally bent from the side plate 40 toward the inner side of the casing 1 so as to oppose the front chassis 3. The term "orthogonal" in the present invention represents approximately orthogonal substantially. Further, the side chassis 4a has a bent part 42 which is approximately L-shaped and bent at the upper edge part of the wall part 41. The bent part 42 has an approximate L shape consisting of an arm part 42a integrally and continuously extending from the upper edge part of the wall part 41 seamlessly, and a contact surface part 42b seamlessly, integrally, and continuously extending from the arm part 42a in the direction crossing the direction of the arm part 42a. In the drawings, the bent part 42 extends from the wall part 41 to the inner side of the casing 1 in an obliquely upward direction as a whole. Alternatively, the following structure may be adopted: the arm part 42a is bent from the upper edge of the wall part 41 to the inner side of the casing 1 orthogonally, and the contact surface part 42b is sloped in an obliquely upper direction.

By forming the bent part 42 by bending the wall part 41 in its edge, a slit 43 is formed between the wall part 41 and the bent part 42.

The front chassis 3 and the side chassis 4 may be formed integrally with the bottom chassis 2 by, for example, bending a single sheet metal. The side chassis 4a is a first sheet metal member.

The first internal chassis 5 includes a plate part 50 that has an attachment part 51 cut and raised therefrom and bent. The attachment part 51 has a screw hole 51a formed therein, and an alignment part 51b extends in the upper direction from the attachment part 51. The first internal chassis 5 is fixed to the second internal chassis 6, such as by screwing at appropriate sites through holes formed in the plate part 50.

The second internal chassis 6 is disposed between the bottom chassis 2 and the first internal chassis 5. The second internal chassis 6 includes a plate part 60 having a cutout 61 formed by cutting out a part of the plate part 60. The opening of the cutout 61 is oriented to the side chassis 4a, and the opening of the slit 43 is oriented to the side chassis 4b, such that the opening of the cutout 61 and the opening of the slit 43 face each other. The second internal chassis 6 is fixed to the bottom chassis 2 with screwing through the screw holes 20a of the bottom chassis 2. The second internal chassis 6 is a second sheet metal member.

The top chassis 7 is disposed in the position facing the bottom chassis 2 while the first internal chassis 5, the second internal chassis 6, and the circuit board 8 are disposed located therebetween.

A holder 9 is fixed to and mounted on the circuit board 8. The holder 9 is provided to ensure the holding strength between the circuit board 8 and a connector 10, and is made by machining a sheet metal appropriately. The holder 9 has side walls 90, 91 to be fixed to the connector 10, and parts of the side walls 90, 91 are bent like flanges to form strip-shaped rail parts 90a, 91a, respectively. The longitudinal directions of the rail parts 90a, 91a are parallel with each other, which are orthogonal to the plane of the circuit board 8. The term "parallel" in the present invention represents approximately parallel substantially.

In the circuit board 8, a hole 80 is formed into which the projected alignment part 51b provided on the first internal chassis 5 is to be inserted. The alignment of the circuit board 8 is performed by inserting the alignment part 51b into the hole 80.

Though not shown in the drawings, a rear chassis is provided in the position opposite to the front chassis 3. The circuit board 8 is accommodated in the casing 1 having a box-shaped appearance.

Next, mounting of the circuit board 8 to the casing 1 will be described.

For mounting the circuit board 8, the second internal chassis 6 is screwed to the bottom chassis 2, and then the first internal chassis 5 is screwed to the second internal chassis 6. The rear chassis (not shown) is then mounted to form the casing 1 having a box shape with the top face opened.

Then, the circuit board 8 is mounted on the casing 1, on which only the top chassis 7 is not yet mounted as described above.

The assembly worker starts mounting operation of the circuit board 8 by roughly aligning the circuit board 8 with respect to the first internal chassis 5 which is already fixed and covering the first internal chassis 5 with the circuit board 8. At this time, if the assembly worker could conduct the work with visual inspection of the position of the alignment part 51b constantly, the assembly worker could perform alignment of the circuit board 8 by inserting the alignment part 51b into the hole 80 of the circuit board 8 without difficulty. In reality, however, the circuit board 8 is not a transparent member; hence, it is difficult for the assembly worker to continue the work with visual inspection of the position of the alignment part 51b constantly. Therefore, even if the position of the hole 80 is deviated from the alignment part 51b, the assembly worker may continue the work without awareness of the deviation, and a mounted component on the circuit board 8 may come into contact with the alignment part 51b, thereby damaging the mounted component.

In the casing 1, the rail part 90a is inserted into the slit 43 formed in the side chassis 4a, and the rail part 91a is inserted into the cutout 61 formed in the second internal chassis 6, and as a result, the holder 9 is guided and aligned. Then, also for the circuit board 8 having the holder 9 fixed thereon, the hole 80 of the circuit board 8 is guided to the position of the alignment part 51b. That is, the assembly worker starts to mount the circuit board 8, aiming at inserting the rail part 90a into the slit 43 and the rail part 91a into the cutout 61.

At this time, the contact surface part 42b forming the edge of the slit 43 is sloped with respect to the direction of insertion of the rail part 90a. Specifically, while the rail part 90a is inserted downward, the bent part 42, a part of which is the contact surface part 42b, extends as a whole from the wall part 41 being parallel with the direction of insertion to an obliquely upper direction crossing the direction of insertion. Then, when the lower end of the rail part 90a comes into contact with the contact surface part 42*b*, the rail part 90*a* is slidingly guided into the slit 43 along the slope of the contact surface part 42*b*. Namely, the assembly worker can securely insert the rail part 90*a* into the slit 43 through the function of the contact surface part 42*b*, even if the assembly worker tries to insert the rail part 90*a* into a position slightly deviated from the slit 43.

The contact surface part 42*b* viewed from the rail part 90*a* to be inserted into the slit 43 can be produced to have a variety of sizes by designing the shape of the sheet metal after die punching when the side chassis 4*a* before bending processing is produced by die punching of the sheet metal. That is, it is possible to form the contact surface part 42*b* to have a width larger than the thickness of the sheet metal. Consequently, the allowable deviation width of the position of the rail part 90*a* with respect to the position of the slit 43 when the rail part 90*a* is inserted into the slit 43 can be increased, and the rail part 90*a* can be slidingly guided into the slit 43 surely.

Since the opening of the slit 43 and the opening of the cutout 61 face each other as described before, when the rail part 90*a* is inserted into the slit 43, at the same time, the rail part 91*a* is inserted into the cutout 61.

Figure 3:
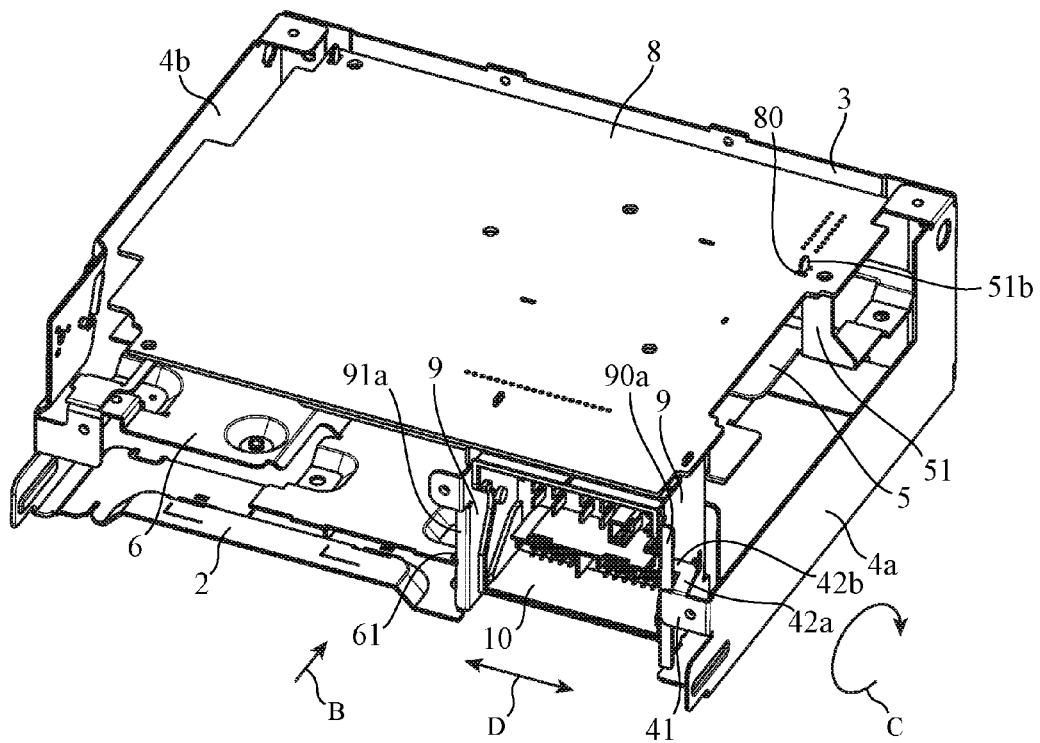
FIG. 3 is a perspective view showing a state after alignment of the circuit board.
Figure 4:
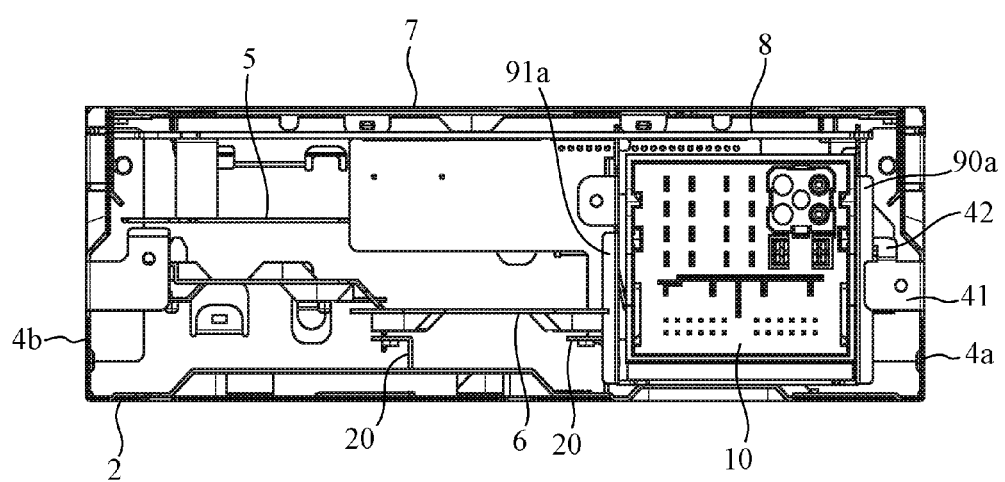
FIG. 4 is a plan view showing a state after alignment of the circuit board.

FIG. 3 is a perspective view that illustrates the state where the circuit board 8 is guided by the insertion of the rail parts 90*a*, 91*a* into the slit 43 and the cutout 61, respectively, and the circuit board 8 is aligned by the insertion of the alignment part 51*b* into the hole 80. In FIG. 3, a part of the side chassis 4*a* is not illustrated. FIG. 4 is a plan view seen from the direction B in FIG. 3 in a state where the top chassis 7 is mounted after the state shown in FIG. 3. Note that the rear chassis is not depicted also in FIGS. 3 and 4.

The wall part 41 which is parallel with the direction of insertion of the rail part 90*a*, and the contact surface part 42*b* located higher than the upper edge part of the wall part 41 restrict the rail part 90*a* from rotating in the direction C in FIG. 3. In addition, since the opening of the slit 43 and the opening of the cutout 61 face each other, the moving of the rail parts 90*a*, 91*a* in the direction D in FIG. 3 is restricted. The holder 9 is thereby stably guided in both of the times during and after the insertion of the rail parts 90*a*, 91*a*, and the circuit board 8 to which the holder 9 is fixed and mounted is also stably guided during the times.

After the alignment of the circuit board 8 is performed by inserting the alignment part 51*b* into the hole 80, the circuit board 8 is fixed to the first internal chassis 5 with a screw using the screw hole 51*a* of the attachment part 51. The mounting of the circuit board 8 on the casing 1 is thereby completed.

In the description above, the rail parts 90*a*, 91*a* are formed on the holder 9 fixed to and mounted on the circuit board 8. Alternatively, besides the holder 9, if a member fixed to and mounted on the circuit board 8 to be protruded from the circuit board 8 exists, the rail parts 90*a*, 91*a* may be formed on the member and respectively inserted into the slit 43 and the cutout 61, respectively. The member having the rail parts 90*a*, 91*a* to be inserted into the slit 43 and the cutout 61 serves as a guide target member.

In the above, a case of assisting the alignment of the circuit board 8 is explained. However, not only a circuit board, but also various members can be treated as a target of the alignment assistance. For example, the structure described above may be used to assist alignment of a resin molded member such as a decorative member. Alternatively, the structure described above may be used to assist alignment of a chassis. If the above structure is used to assist alignment of a chassis, the guide target member having the rail parts 90*a*, 91*a* can be integrally formed with the chassis, for example by bending a sheet metal appropriately. A part of a member serving as a target of the alignment assistance may be used as the rail parts 90*a*, 91*a* as it is. For example, in a case of a flat plate member such as a circuit board, the two outer edges being in parallel with each other may be used to function as the rail parts 90*a*, 91*a* so that the flat plate member is guided to a position at which an alignment can be achieved. In this manner, parallel parts which are originally included in a member serving as a target of an alignment assistance can be used as rail parts 90*a*, 91*a*.

In the description above, the bent part 42 is formed by bending the upper edge part of the wall part 41. Alternatively, a bent portion may be formed by bending the wall part 41 in its lower edge part such that a slit having an opening facing the opening of the cutout 61 and into which the rail part 90*a* is to be inserted is formed between the bent portion and the wall part 41. Also in this case, the bent portion has an arm part extending in a direction crossing the direction of insertion of the rail part 90*a*, and a contact surface part extending from the arm part in a direction crossing the direction of the arm part. The contact surface part is sloped with respect to the direction of insertion of the rail part 90*a* such that the rail part 90*a* being in contact with the contact surface part is slidingly guided into the slit.

Similar to the contact surface part 42*b*, a sloped surface sloped to the direction of insertion of the rail part 91*a* may also be disposed in the vicinity of the cutout 61 so that when the lower edge of the rail part 91*a* comes into contact with the sloped surface, the rail part 91*a* is slidingly guided into the cutout 61 along the slope.

As described above, in the assembly alignment assistance structure for a member according to embodiment 1, the circuit board 8 is guided to a position where an alignment can be achieved by inserting the rail parts 90*a*, 91*a* of the holder 9 fixed to and mounted on the circuit board 8 into the slit 43 provided on the side chassis 4*a* and the cutout 61 provided on the second internal chassis 6. The rail part 90*a* is then slid into the slit 43 through the contact surface part 42*b* that is sloped with respect to the direction of insertion. The size of the contact surface part 42*b* can be designed to be larger than the thickness of the sheet metal forming the side chassis 4*a*. Further, since the openings of the slit 43 and the opening of the cutout 61 face each other, the rail parts 90*a*, 91*a* are stably guided without being dismounted from the slit 43 and the cutout 61. Therefore, the circuit board 8 on which the holder 9 is fixed and mounted is guided to an appropriate position with high reliability. This enables smooth alignment, even if the alignment part 51*b* is not visible to an assembly worker, and the work efficiency is improved. In addition, by providing a structure for assembly alignment assistance of a member using the side chassis 4*a* and the second internal chassis 6, and the rail parts 90*a*, 91*a* serving as counterparts thereof on holder 9, it is possible to realize the structure with low cost by using existing members.

It should be noted that, in the present invention, any component can be modified or omitted in embodiments within the scope of the invention.

INDUSTRIAL APPLICABILITY

As described above, in the assembly alignment assistance structure for a member according to the present invention, the member can be guided in high reliability. Therefore, the present invention is suitable for an assistance structure for aligning a circuit board to a casing by forming the structure in the casing for installing the circuit board on which electronic parts are mounted

REFERENCE SIGNS LIST 1 casing
2 bottom chassis
3 front chassis
4 side chassis
4a side chassis
4b side chassis
5 first internal chassis
6 second internal chassis
7 top chassis
8 circuit board
9 holder
10 connector
20 attachment part
20a screw hole
40 side plate
41 wall part
42 bent part
42a arm part
42b contact surface part
43 slit
50 plate
51 attachment part
51a screw hole
51b alignment part
60 plate part
61 cutout
80 hose
90 side wall
90a rail part
91 side wall
91a rail part

The invention claimed is:

1. An assembly alignment assistance structure for a member comprising:
a first sheet metal member having a wall part and a bent part, the wall part being in parallel with a direction of insertion of a first rail part of a guide target member, the bent part being bent at an edge part of the wall part such that a slit into which the first rail part is inserted is formed between the bent part and the wall part;
a second sheet metal member having a cutout, into which a second rail part of the guide target member is to be inserted, the second rail part extending in parallel with the first rail part, the cutout forming an opening facing an opening of the slit; wherein
the bent part has an arm part extending from the edge part of the wall part in a direction crossing the direction of insertion and a contact surface part extending from the arm part in a direction crossing the direction of the arm part, the slit being formed as a gap between the wall part and the contact surface part; and
the contact surface part is sloped with respect to the direction of insertion such that, when the guide target member is inserted, the first rail part coming into contact with the contact surface part is slidingly guided into the slit.

2. A casing of an electronic device comprising the assembly alignment assistance structure of the member according to claim 1.

* * * * *